(12) United States Patent
Obergrussberger

(10) Patent No.: US 6,784,691 B2
(45) Date of Patent: Aug. 31, 2004

(54) INTEGRATED CIRCUIT HAVING A CONNECTION PAD FOR STIPULATING ONE OF A PLURALITY OF ORGANIZATION FORMS, AND METHOD FOR OPERATING THE CIRCUIT

(75) Inventor: Xaver Obergrussberger, Pleiskirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/324,432

(22) Filed: Dec. 20, 2002

(65) Prior Publication Data

US 2003/0117167 A1 Jun. 26, 2003

(30) Foreign Application Priority Data

Dec. 20, 2001  (DE) .......................................... 101 62 913

(51) Int. Cl.[7] ............................................... G06F 7/38
(52) U.S. Cl. ............................. 326/37; 326/62; 326/83; 326/86
(58) Field of Search ............................. 326/37–39, 62, 326/83, 86, 101

(56) References Cited

U.S. PATENT DOCUMENTS 5,912,563 A * 6/1999 Garnett ........................ 326/60
6,229,343 B1 * 5/2001 Bauer et al. ................. 326/104
6,411,123 B1 * 6/2002 Chang .......................... 326/38
6,411,127 B2 * 6/2002 Lee .............................. 326/83
6,417,692 B2 * 7/2002 Shiflet .......................... 326/41

FOREIGN PATENT DOCUMENTS

DE    199 34 297 C1    10/2000

* cited by examiner

Primary Examiner—Michael Tokar
Assistant Examiner—Khai M. Nguyen
(74) Attorney, Agent, or Firm—Laurence A. Greenberg; Werner H. Stemer; Ralph E. Locher

(57) ABSTRACT

An integrated circuit can be operated in at least three different organization forms that can be set externally. A connection pad receives an external signal for stipulating one of the organization forms. An input of a control circuit for setting one of the organization forms is connected to the connection pad. Depending on the signal on the connection pad, the control circuit can generate at least three different states at the output to identify the respective organization forms. When the signal state has been read and the corresponding organization form has been activated, the control circuit is disconnected from a voltage supply for the integrated circuit. The inventive circuit allows the number of connection pads for stipulating the organization form to be kept low.

5 Claims, 1 Drawing Sheet

INTEGRATED CIRCUIT HAVING A CONNECTION PAD FOR STIPULATING ONE OF A PLURALITY OF ORGANIZATION FORMS, AND METHOD FOR OPERATING THE CIRCUIT

BACKGROUND OF THE INVENTION

1. Field of the Invention

The present invention relates to an integrated circuit which can be operated in at least three different organization forms which can be set externally, and has a connection pad which can receive an external signal stipulating one of the organization forms.

Integrated circuits, such as integrated memory circuits, are used in different data configurations or organization forms. The organization forms differ, in particular, in the number of data lines used which are connected to data connection pads, "I/O pads". Upon selection of one of the settable organization forms, a system bus width predetermined by an environment can be set. The data connection pads are used for interchanging data between the integrated circuit and a system controller, for example. There are "x4", "x8" and "x16" organization forms, which use 4, 8 or 16 data lines per circuit or chip for data interchange.

If the fundamental configuration of an integrated circuit allows it to be used in all of the x4, x8 and x16 organization forms, and accordingly allows the data length for a data bus in the circuit to be configured, it is necessary to set the organization form in question before the integrated circuit is put into operation. For this purpose, a plurality of connection pads are generally provided which can receive external signals or connections for stipulating a respective organization form.

To set the three aforementioned organization forms for an integrated circuit, two connection pads are provided, for example, which receive three different types of connection. This involves the connection pads either having ground potential connected to them, for example, or being left floating. By way of example, the respective organization forms are set by generating respectively different states when the ground potential is connected to a first connection pad, when the ground potential is connected to a second connection pad, and when both connection pads are left floating. Each of the states is significant to an organization form.

In order to provide connection pads on a chip in an integrated circuit, it is necessary to make a certain surface area available on the chip. As the development of integrated circuits progresses to an increasing extent, the aim in this context is to reduce the size of the chip area further. Since the size of the connection area on connection pads cannot be reduced arbitrarily, the increasing reduction in the size of the chip area results in problems in still accommodating the necessary connection pads on the chip.

SUMMARY OF THE INVENTION

It is accordingly an object of the invention to provide an integrated circuit having a connection pad for stipulating one of a plurality of organization forms, and a method for operating the circuit that overcome the above-mentioned disadvantages of the prior art devices and methods of this general type, in which the number of connection pads required for stipulating one of a plurality of organization forms for the integrated circuit can be kept as low as possible.

With the foregoing and other objects in view there is provided, in accordance with the invention, an integrated circuit. The circuit contains a connection pad for receiving an external signal for stipulating one of at least three different organization forms for operating the integrated circuit and a control circuit for setting one of the three different organization forms. The control circuit has an input and an output. The input is connected to the connection pad, and the control circuit is able to generate at least three different states at the output to identify a respective organization form, depending on the external signal applied to the connection pad.

The inventive integrated circuit is provided with a control circuit for setting one of the organization forms for the integrated circuit. The control circuit has an input and an output, the input is connected to the connection pad that can be used for stipulating one of the organization forms externally. The control circuit is in a form such that it generates at least three different states at its output to identify the respective organization forms, depending on the signal on the connection pad. Provision of the control circuit allows at least one connection pad to be saved as compared with the embodiment described in the introduction. The invention requires only one connection pad to be provided in order to set at least three different organization forms for the integrated circuit.

In one mode of the integrated circuit, for example after the supply voltage of the integrated circuit has been connected in an initialization mode, the signal state at the output of the control circuit is checked. According to the signal state that is read at the output of the control circuit, one of the organization forms is activated. The control circuit is then disconnected from the voltage supply for the integrated circuits, which achieves a reduction in power consumption.

This advantageously prevents provision of the control circuit from causing additional power consumption in a normal mode of the integrated circuit, for example.

The invention can be used particularly advantageously for an integrated circuit in the form of a memory circuit, for example in the form of a DRAM memory. In line with the invention, it is thus possible to use just one connection pad to set one of the x4, x8 or x16 organization forms.

In one embodiment of the present invention, the control circuit generates respectively different states at the output when a first supply voltage is connected to the connection pad, when a second supply voltage, which is different than the first supply voltage, is connected to the connection pad, and when nothing is connected to the connection pad.

In one development of the control circuit, the control circuit has a first and a second resistor series circuit that are connected in parallel with one another. An output signal at the output of the control circuit is produced by tapping off and comparing a first potential on the first resistor series circuit and a second potential on the second resistor series circuit. The connection pad is connected to one of the resistor series circuits.

In accordance with an added feature of the invention, the first resistor series circuit has a first resistor and a second resistor connected in series. The second resistor series circuit has a third resistor, a fourth resistor and a fifth resistor all connected in series. A first output signal at the output of the control circuit is produced by tapping off and comparing a potential between the first and second resistors and a potential between the third and fourth resistors. A second output signal at the output of the control circuit is produced by tapping off and comparing the potential between the first and second resistors and a potential between the fourth and fifth resistors. The connection pad is connected between the first and second resistors.

In accordance with another feature of the invention, the first and second resistors have different values from one another, and the fourth and fifth resistors in total have essentially a value of the third resistor.

Other features which are considered as characteristic for the invention are set forth in the appended claims.

Although the invention is illustrated and described herein as embodied in an integrated circuit having a connection pad for stipulating one of a plurality of organization forms, and a method for operating the circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
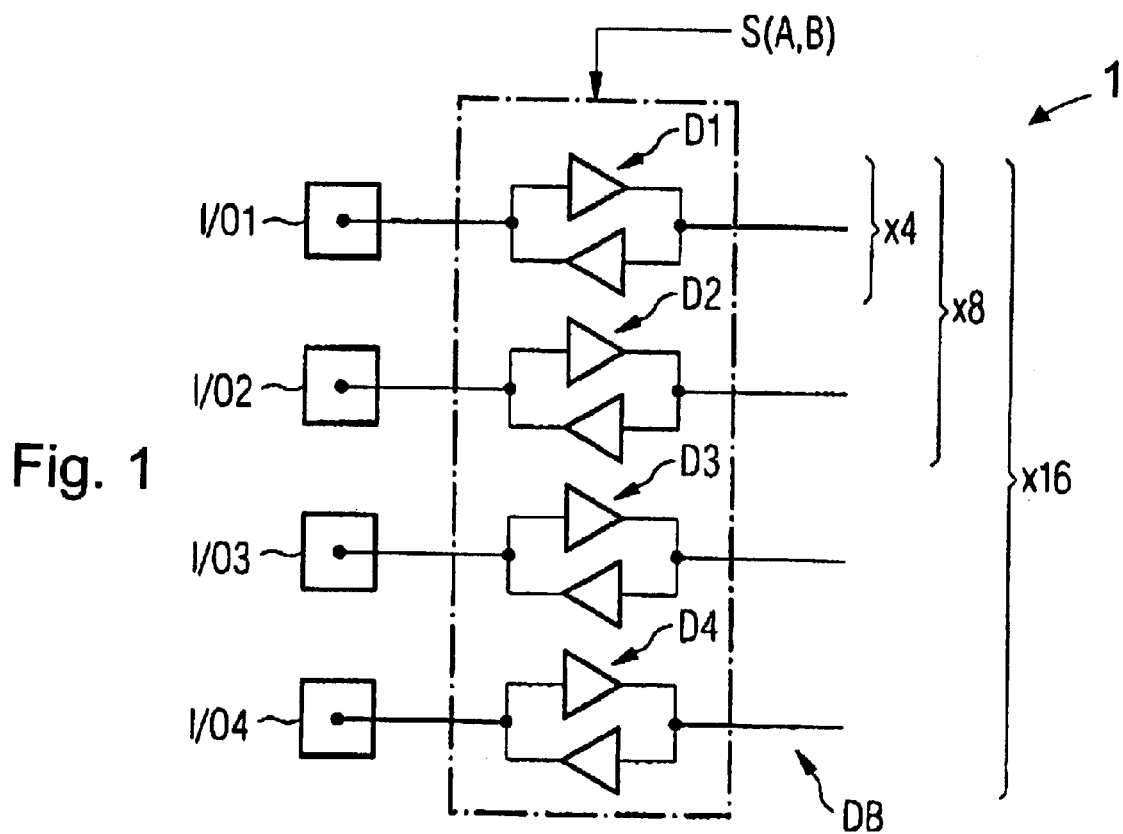
FIG. 1 is a circuit diagram of an integrated circuit according to the invention.

Referring now to the figures of the drawing in detail and first, particularly, to FIG. 1 thereof, there is shown an embodiment of an inventive integrated circuit 1 which has an exemplary number of data connection pads I/O1 to I/O4. The data connection pads I/O1 to I/O4 are used for transmitting data signals on a data bus DB. The data connection pads I/O1 to I/O4 are connected to the data bus DB via respective driver circuits D1 to D4. The integrated circuit 1 shown is in the form of a memory circuit in the present exemplary embodiment. Its basic configuration results in that it is configured for x4, x8 and x16 data input/data output organization forms, for example, and accordingly has 16 data connection pads, of which only four data connection pads I/O1 to I/O4 are shown in FIG. 1 for the sake of clarity, however. In the present exemplary embodiment, it will also be assumed that the x16 organization form uses all the data connection pads I/O1 to I/O4 for data transmission, the x8 organization form uses just the data connection pads I/O1, I/O2, and the x4 organization form uses just the data connection pad I/O1. Accordingly, the x8 organization form deactivates the driver circuits D3 and D4, under the control of a signal S(A,B), and the x4 organization form additionally deactivates the driver circuit D2.

Figure 2:
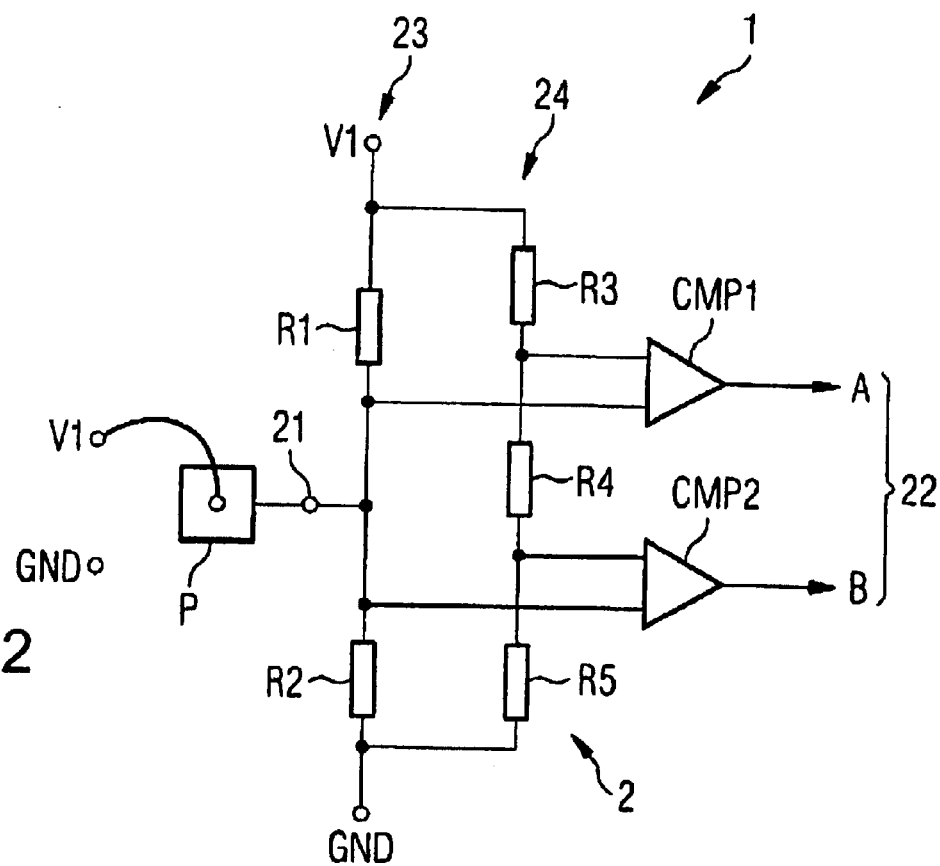
FIG. 2 is a circuit diagram of a control circuit of the integrated circuit.

The circuit 1 also has a connection pad P that can have a voltage potential connected to it externally, for example by bonding, for stipulating the organization form for the circuit 1 (see FIG. 2). The connection pad P is connected to an input 21 of a control circuit 2 that is used for setting one of the organization forms for the circuit 1. The control circuit 2 has a first resistor series circuit 23 and a second resistor series circuit 24. The first resistor series circuit 23 has a first resistor R1 and a second resistor R2. The second resistor series circuit 24 contains a third resistor R3, a fourth resistor R4 and a fifth resistor R5.

Inputs of a comparator CMP1 have potentials applied to them that are tapped off between the first resistor R1 and the second resistor R2 and between the third resistor R3 and the fourth resistor R4. The potentials at the two inputs of the comparator CMP1 are compared, and this produces an output signal A at an output of the comparator CMP1. Inputs of a second comparator CMP2 have potentials applied to them that are tapped off between the first resistor R1 and the second resistor R2 and between the fourth resistor R4 and the fifth resistor R5. The potentials at the two inputs of the comparator CMP2 are compared with one another, and this produces an output signal B. The connection pads P is connected to the input 21 between the resistors R1 and R2.

The resistors R1 and R2 are proportioned such that they are not of the same size. Accordingly, they have different values. The resistors R4 and R5 should in total assume essentially the resistance value of R3. Such proportioning and configuration of the control circuit 2 results in at least three different states of the output signals A and B being produced at the output 22 depending on the connection on (i.e. the signal at) the connection pad P.

To produce a first state, a supply voltage V1 is connected to the connection pad P. The supply voltage V1 assumes a positive value, for example. The result of this is that the output signals A and B are set to "0". If the connection pad P is connected to ground potential GND, the two output signals A and B are set to "1". If there is no connection on the connection pad P, the states of the output signals A and B are different than one another, for example the output signal A assumes the state "1" and the output signal B assumes the state "0". On the basis of the states of the output signals A and B, the signal S(A,B) is generated.

The signal state of the output 22 of the control circuit 2 is read, by way of example, in an initialization mode of the circuit 1 after the voltage supply has been connected. According to the state of the output signals A, B that is read, the corresponding organization form for the circuit 1 is activated. When the organization form has been set, the control circuit 2 is disconnected from the voltage supply, which results in that it no longer draws current. Thus, in a normal mode for the integrated circuit 1, additional power consumption by the control circuit 2 is prevented.

I claim:

1. An integrated circuit, comprising:
   a connection pad for receiving an external signal for stipulating one of at least three different organization forms for operating the integrated circuit; and
   a control circuit for setting one of the three different organization forms, said control circuit having a first resistor series circuit, a second resistor series circuit connected in parallel to said first resistor series circuit, an input and an output, said input and one of said first and second resistor series circuits being connected to said connection pad, and said control circuit being able to generate an output signal having any of at least three different states at said output to identify a respective organization form, depending on the external signal applied to said connection pad, said output signal being produced by tapping off and comparing a first potential on said first resistor series circuit and a second potential on said second resistor series circuit.

2. The integrated circuit according to claim 1, wherein said control circuit generates the three different states at said output, when a first supply voltage is applied to said connection pad, when a second supply voltage being different than the first supply voltage, is applied to said connection pad, and when nothing is applied to said connection pad.

3. The integrated circuit according to claim 1, wherein:
said first resistor series circuit has a first resistor and a second resistor connected in series;
said second resistor series circuit has a third resistor, a fourth resistor and a fifth resistor all connected in series;
a first output signal at said output of said control circuit is produced by tapping off and comparing a potential between said first and second resistors and a potential between said third and fourth resistors;
a second output signal at said output of said control circuit is produced by tapping off and comparing the potential between said first and second resistors and a potential between said fourth and fifth resistors; and
said connection pad is connected between said first and second resistors.

4. The integrated circuit according to claim 3, wherein said first and second resistors have different values from one another, and said fourth and fifth resistors in total have essentially a value of said third resistor.

5. A method for operating an integrated circuit, which comprises the steps of:
generating a signal at an output of a control circuit by tapping off and comparing a first potential on a first resistor series circuit with a second potential on a second resistor series circuit connected in parallel with the first resistor series circuit;
checking a signal state of the signal at the output of a the control circuit;
activating one of multiple organization forms in dependence on the signal state; and
upon activating one of the multiple organization forms, disconnecting the control circuit from a voltage supply for the integrated circuit.

* * * * *